United States Patent
Chen et al.

(10) Patent No.: US 10,157,775 B2
(45) Date of Patent: Dec. 18, 2018

(54) METHOD FOR MANUFACTURING A SEMICONDUCTOR DEVICE

(71) Applicant: TAIWAN SEMICONDUCTOR MANUFACTURING CO., LTD., Hsinchu (TW)

(72) Inventors: Chih-Hao Chen, Hsinchu (TW); Jyu-Horng Shieh, Hsin-Chu (TW); Ming-Chung Liang, Hsin-chu (TW); Shu-Huei Suen, Hsinchu County (TW); Wen-Yen Chen, HsinChu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/483,100

(22) Filed: Apr. 10, 2017

(65) Prior Publication Data

US 2018/0294185 A1    Oct. 11, 2018

(51) Int. Cl.
| H01L 21/44 | (2006.01) |
| H01L 21/768 | (2006.01) |
| H01L 21/033 | (2006.01) |
| H01L 23/522 | (2006.01) |
| H01L 23/528 | (2006.01) |

(52) U.S. Cl.
CPC .... H01L 21/76816 (2013.01); H01L 21/0332 (2013.01); H01L 21/0337 (2013.01); H01L 23/5226 (2013.01); H01L 23/5283 (2013.01)

(58) Field of Classification Search
CPC ............. H01L 21/302; H01L 21/76811; H01L 21/76813; H01L 21/76816; H01L 21/0332; H01L 21/0337; H01L 23/5226; H01L 23/5283

USPC ................ 438/624, 639, 647, 648, 702, 703
See application file for complete search history.

(56) References Cited

U.S. PATENT DOCUMENTS

| 8,222,151 B2 | 7/2012 | Liang et al. | |
| 8,940,643 B2 | 1/2015 | Ko et al. | |
| 2012/0231622 A1* | 9/2012 | Chen ................... | H01L 21/4846 438/623 |
| 2013/0337650 A1* | 12/2013 | Lee ....................... | H01L 21/302 438/702 |
| 2014/0199847 A1* | 7/2014 | Kasahara ............ | H01L 21/0337 438/703 |

* cited by examiner

*Primary Examiner* — Brook Kebede
(74) *Attorney, Agent, or Firm* — McDermott Will & Emery LLP

(57) ABSTRACT

In a pattern forming method, a stacked structure, including a bottom layer, a middle layer and a first mask layer, is formed. The middle layer includes a first cap layer, an intermediate layer and a second cap layer. The first mask layer is patterned by using a first resist pattern as an etching mask. The second cap layer is patterned by using the patterned first mask layer as an etching mask. A second mask layer is formed over the patterned second cap layer, and is patterned by using a second resist pattern as an etching mask. The second cap layer is patterned by using the patterned second mask layer as an etching mask. The intermediate layer and the first cap layer are patterned by using the patterned second cap layer as an etching mask. The bottom layer is patterned by using the patterned first cap layer as an etching mask.

20 Claims, 17 Drawing Sheets

METHOD FOR MANUFACTURING A SEMICONDUCTOR DEVICE

TECHNICAL FIELD

The disclosure relates to method for manufacturing semiconductor integrated circuits, and more particularly to method for patterning using multilayer mask structures.

BACKGROUND

As the semiconductor industry has progressed into nanometer technology process nodes in pursuit of higher device density, higher performance, and lower costs, challenges from both fabrication and design issues have greater. For example, multilayer mask structures are used for forming contact holes (vias) and/or metal connections in and/or through an interlayer dielectric (ILD) layer disposed above a semiconductor device, such as field effect transistors (FETs).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
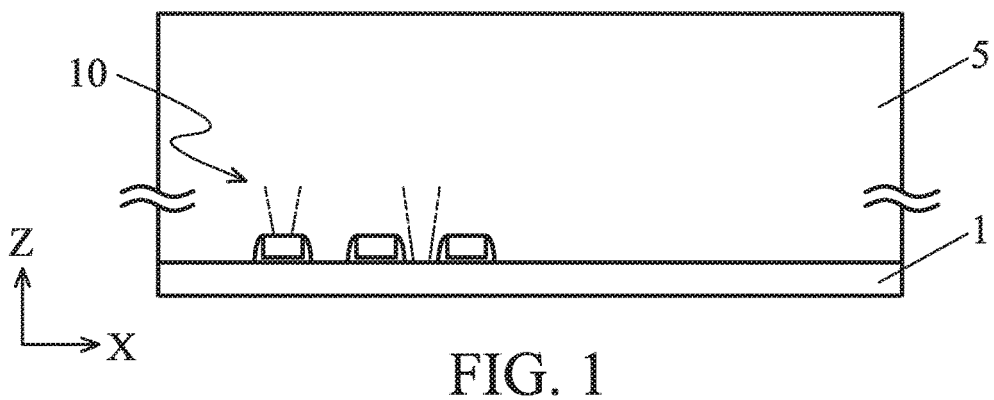
FIG. 1 is an exemplary cross sectional view of one of the various stages of a sequential semiconductor device manufacturing process according to some embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Various embodiments of the disclosure relate to semiconductor devices and methods for forming the same. In various embodiments, the semiconductor device includes fin field effect transistors (FinFETs), gate all-around FET (GAA FET), and/or other MOS transistors, together with capacitors, resistances and/or other electronic elements.

The semiconductor devices include interconnect structures that include a plurality of interconnect pattern (line) layers having conductive patterns and a plurality of contact holes/vias for connecting various features in one portion/feature of a semiconductor chip (die) to other portions/features of the chip. The interconnect and via structures are formed of conductive materials such as metal, and the semiconductor devices include several interconnect layers in various embodiments.

The interconnect layer patterns in different layers are also coupled to one another through vias that extend vertically between one or several interconnect layers. The interconnect layer patterns are coupled to external features and can represent bit lines, signal lines, word lines, and various input/output connections in some embodiments. In some embodiments of the disclosure, each of the interconnect structures is formed by a damascene process, in which a layer of inter-metal dielectric (IMD) material is deposited, trenches and vias are formed and filled with conductive material (e.g., copper or aluminum or various alloys) and the surface is planarized by chemical mechanical polishing (CMP), although other patterning techniques are used in other embodiments. Since a resolution limit of photolithography processes, multiple patterning lithograph processes are used to form densely arranged interconnects and/or vias.

As shown in FIG. 1, underlying devices 10 such as FETs are formed over a substrate 1. Further, the underlying devices 10 are covered by a first interlayer dielectric (ILD) layer 5.

In one embodiment, the substrate 1 is a silicon substrate. Alternatively, the substrate 1 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. Amorphous substrates, such as amorphous Si or amorphous SiC, or an insulating material, such as silicon oxide may also be used as the substrate 1. The substrate 1 may include various regions that have been suitably doped with impurities (e.g., p-type or n-type conductivity).

The first ILD layer 5 includes silicon oxide, silicon nitride, silicon oxynitride (SiON), SiOCN, fluorine-doped silicate glass (FSG), or a low-k dielectric material, or any other suitable dielectric material. The first ILD layer 5 may be formed by chemical vapor deposition (CVD) or other suitable film forming processes.

Examples of the underlying devices 10 may include static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, such as a FinFET, bipolar transistors, high voltage transistors, high frequency transistors, other memory cells, and combinations thereof. The semiconductor device may include a plurality of semiconductor devices (e.g., transistors), which may be interconnected. It is understood, however, that the application should not be limited to a particular type of device, except as specifically claimed.

Figure 2:
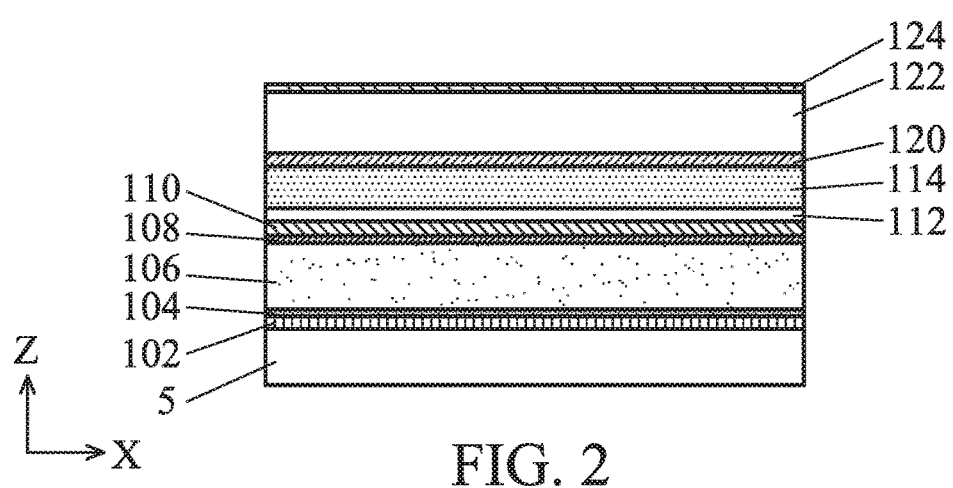
FIG. 2 is an exemplary cross sectional view of one of the various stages of a sequential semiconductor device manufacturing process according to some embodiments of the present disclosure.

After the first ILD 5 is formed, a multilayer structure is formed over the first ILD layer 5, as shown in FIG. 2.

In FIG. 2, a contact etch stop layer (CESL) 102 is formed on the first ILD layer 5, and a first liner layer 104 is formed on the CESL 102.

The CESL 102 is made of one or more layers of silicon oxide or silicon nitride based materials such as SiN, SiCN, SiON or SiOCN. In one embodiment, silicon nitride is used. The thickness of the CESL 102 is in a range from about 5 nm to about 20 nm in some embodiments.

The first liner layer 104 is made of one or more layers of silicon oxide or silicon nitride based materials such as SiN, SiCN, SiON or SiOCN, different from the CESL 102. In one embodiment, SiOC is used. The thickness of the first liner layer 104 is in a range from about 5 nm to about 40 nm in some embodiments.

Further, a second ILD layer 106 is formed on the first liner layer 104. The second ILD layer 106 includes silicon oxide, silicon nitride, silicon oxynitride (SiON), SiOCN, fluorine-doped silicate glass (FSG), or a low-k dielectric material, or any other suitable dielectric material. In one embodiment, the second ILD layer 106 is a low-k dielectric material layer.

The expression "low-k" material refers to materials with a dielectric constant less than about 3.9. Suitable low-k dielectric materials include flowable oxides which are basically ceramic polymers, such as hydrogen silsesquioxane (HSQ). HSQ-type flowable oxides have been considered for gap filling between metal lines because of their flowability and ability to fill small openings. Additional low-k dielectrics include organic low-k materials, typically having a dielectric constant of about 2.0 to about 3.8. Organic low-k materials include a poly(arylene) ether, BCB (divinylsiloxane bis-benzocyclobutene), and organic-doped silica glasses (OSG) (also known as carbon-doped glasses). Other suitable types of low-k dielectrics are fluorine-doped silica glasses (FSG) and SiCOH. FSG include dielectrics formed from precursor gases $SiF_4$, $SiH_4$, and $N_2O$ and dielectrics formed from the precursors $SiF_4$, tetraethylorthosilicate (TEOS), and $O_2$. Dielectrics formed from TEOS and $SiF_4$ are known as fluorinated TEOS or FTEOS. The low-k dielectric material may be formed by CVD, atomic layer deposition (ALD), or other suitable film forming processes. The thickness of the second ILD layer 106 is in a range from about 80 nm to about 150 nm in some embodiments.

Moreover, a second liner layer 108 is formed on the second ILD layer 106. The second liner layer 108 is a nitrogen-free dielectric layer. In some embodiments, $SiO_2$ is used. The second liner layer 108 can be fabricated in a CVD process, optionally plasma-enhanced, using a gaseous mixture of carbon, silicon, and oxygen sources. In some embodiments, the process parameters can be adjusted to obtain acceptable values of the refractive index n and extinction coefficient k.

In some embodiments, the second liner layer 108 is made of a tetraethylorthosilicate (TEOS) based dielectric material, which is a known layer commonly used as a crosslinking agent in silicone polymers and as a precursor to silicon dioxide in the semiconductor industry. In some embodiments, the TEOS based layer can be deposited by spin-on-glass deposition method, although other deposition methods can be used.

The thickness of the second liner layer 108 is in a range from about 20 nm to about 40 nm in some embodiments.

In addition, a nitride layer 110, such as a TiN layer, is subsequently disposed over the second liner layer 108. The nitride layer 110 may be formed by CVD, ALD, or physical vapor deposition (PVD) including sputtering, or any other suitable film formation methods. The thickness of the nitride liner layer 110 is in a range from about 20 nm to about 40 nm in some embodiments.

In some embodiments of the present disclosure, the layers 102, 104, 106, 108 and 110 may be referred to as a bottom layer.

Subsequently, as shown in FIG. 2, a first cap layer 112 is formed on the nitride layer 110. The first cap layer 112 is made of one or more layers of a silicon nitride based material, a silicon carbide based material or a metal nitride material, such as SiN, SiCN, SiC, SiCN, BN, TiN or TaN. The first cap layer 112 may be formed by CVD, ALD, or PVD, or any other suitable film formation methods. The thickness of the first cap layer 112 is in a range from about 20 nm to about 40 nm in some embodiments.

Then, an intermediate layer 114 is formed on the first cap layer 112. The intermediate layer 114 is made of an amorphous or polycrystalline semiconductor material, such as amorphous Si (a-Si), a-Ge, a-SiGe, polysilicon (poly-Si), poly-SiGe or poly-Ge. The intermediate layer 114 may be formed by CVD, ALD, or PVD, or any other suitable film formation methods. The thickness of the intermediate layer 114 is greater than the first cap layer 112 and is in a range from about 30 nm to about 70 nm in some embodiments.

Further, a second cap layer 120 is formed on the intermediate layer 114. The second cap layer 120 has a different etching rate than the first cap layer 112. The second cap layer 120 is made of one or more layers of a silicon oxide based material, such as $SiO_2$, SiOC or SiOCH. The second cap layer 120 may be formed by CVD, ALD, or PVD, or any other suitable film formation methods. The thickness of the second cap layer 120 is in a range from about 10 nm to about 40 nm in some embodiments.

In other embodiments, the first cap layer 112 is made of one or more layers of a silicon oxide based material, such as $SiO_2$, SiOC or SiOCH, and the second cap layer 120 is made of one or more layers of a silicon nitride based material, a silicon carbide based material or a metal nitride material, such as SiN, SiCN, SiC, SiCN, BN, TiN or TaN.

In some embodiments of the present disclosure, the layers 112, 114 and 120 may be referred to as a middle layer.

Still referring to FIG. 2, a first lower mask layer 122 is formed on the middle layer and a first upper mask layer 124 is formed on the first lower mask layer 122.

In some embodiments, the first lower mask layer 122 is made of an organic material. The organic material may include a plurality of monomers or polymers that are not cross-linked. Generally, the first lower mask layer 122 may contain a material that is patternable and/or have a composition tuned to provide anti-reflection properties. Exemplary materials for the first lower mask layer 122 include carbon backbone polymers. The first lower mask layer 122 is used to planarize the structure, as the underlying structure may be uneven depending on the structure of the devices 10 formed on the substrate 1. In some embodiments, the first lower mask layer 122 is formed by a spin coating process. In other embodiments, the first lower mask layer 122 is formed by another suitable deposition process. The thickness of the first lower mask layer 122 is in a range from about 80 nm to about 120 nm in some embodiments.

The first upper mask layer 124 may have a composition that provides anti-reflective properties and/or hard mask properties for the photolithography process. In some embodiments, the first upper mask layer 124 includes a silicon containing layer (e.g., a silicon hard mask material). The first upper mask layer 124 may include a silicon-containing inorganic polymer. In other embodiments, the first upper mask layer 124 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The first upper mask layer 124 may be formed by a spin-on coating process, CVD, PVD, and/or other suitable deposition processes. The thickness of the first upper mask layer 124 is in a range from about 15 nm to about 30 nm in some embodiments.

In some embodiments of the present disclosure, the layers 122 and 124 may be referred to as a first mask layer. In the following embodiments, the structure of FIG. 2 is employed.

Figure 3A:
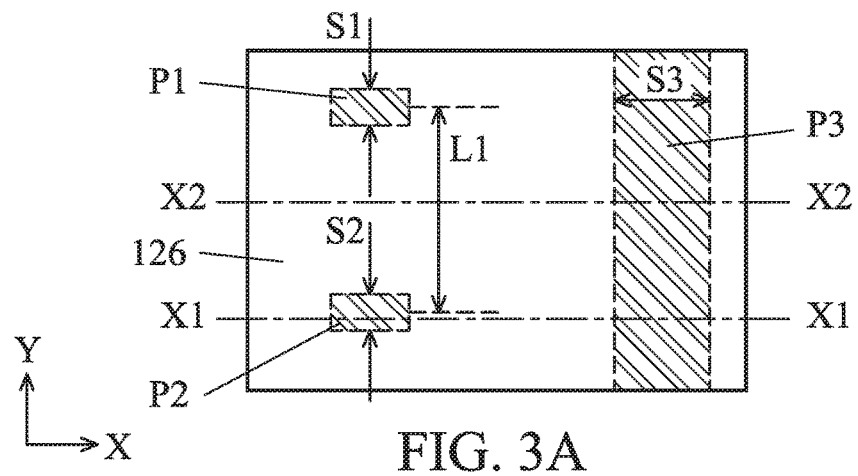
FIG. 3A is an exemplary plan view (top view) of one of the various stages of a sequential semiconductor device manufacturing process.
Figure 3B:
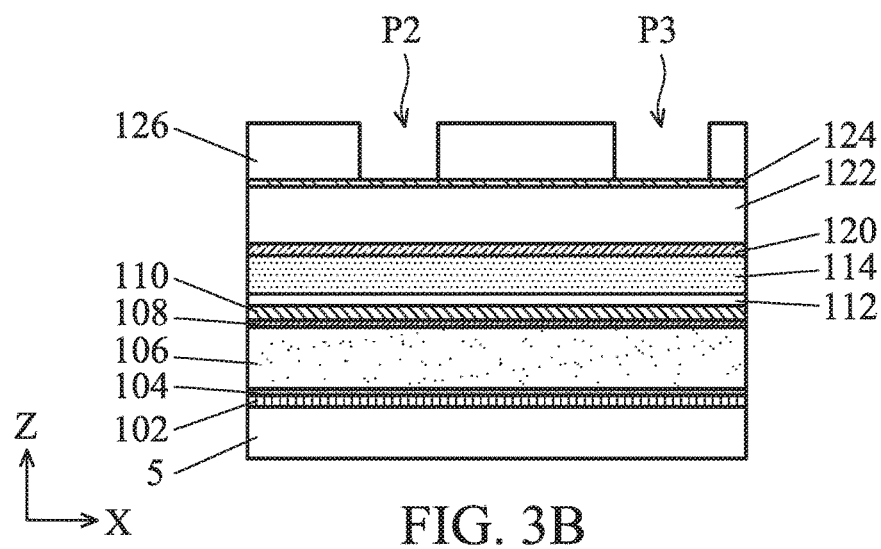
FIG. 3B is an exemplary cross sectional view corresponding to line X1-X1 of FIG. 3A.
Figure 3C:
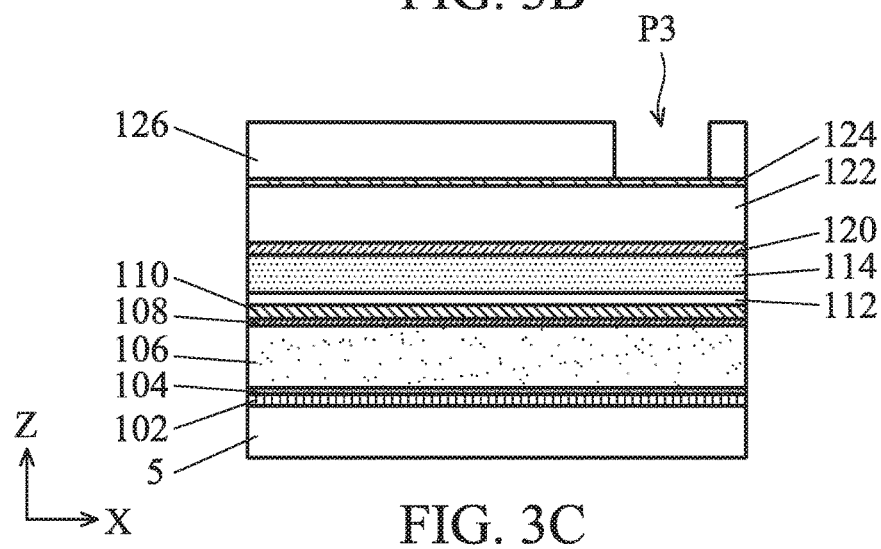
FIG. 3C is an exemplary cross sectional view corresponding to line X2-X2 of FIG. 3A, according to some embodiments of the present disclosure.

According to FIGS. 3A-3C, a first photo resist pattern 126 is formed on the mask layer by a lithography operation. The first photo resist pattern 126 includes first to third openings P1, P2 and P3.

Figure 4A:
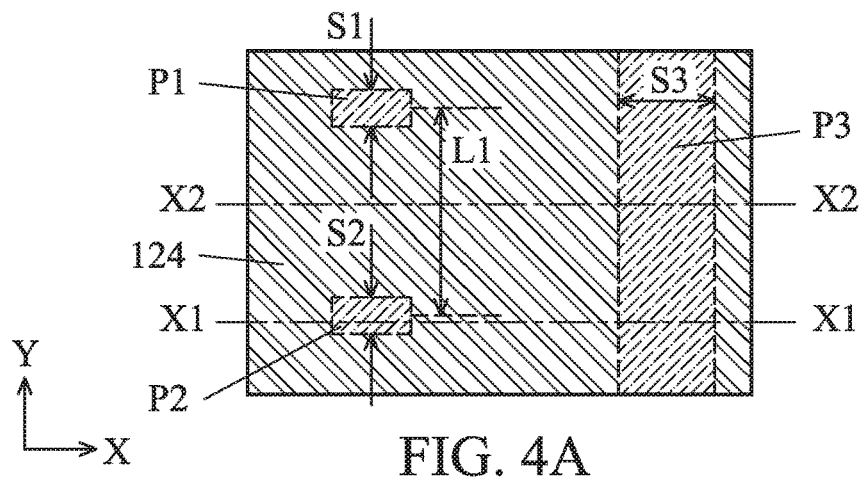
FIG. 4A is an exemplary plan view (top view) of one of the various stages of a sequential semiconductor device manufacturing process.
Figure 4B:
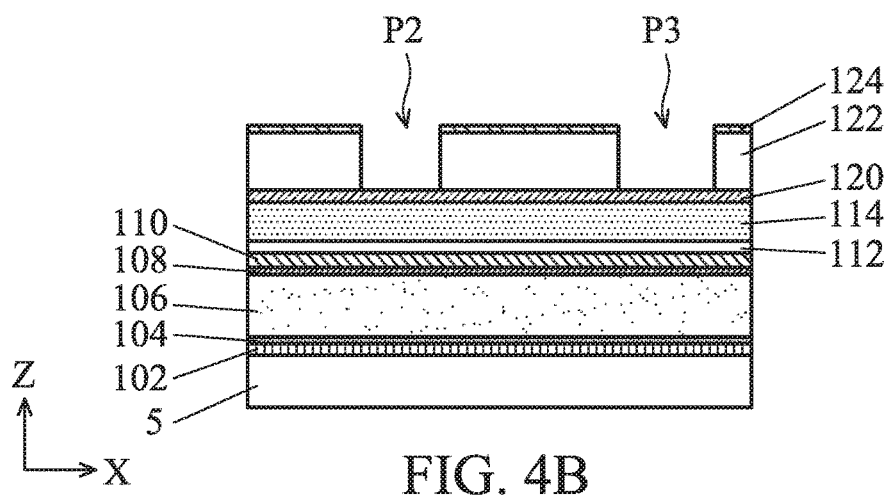
FIG. 4B is an exemplary cross sectional view corresponding to line X1-X1 of FIG. 4A.
Figure 4C:
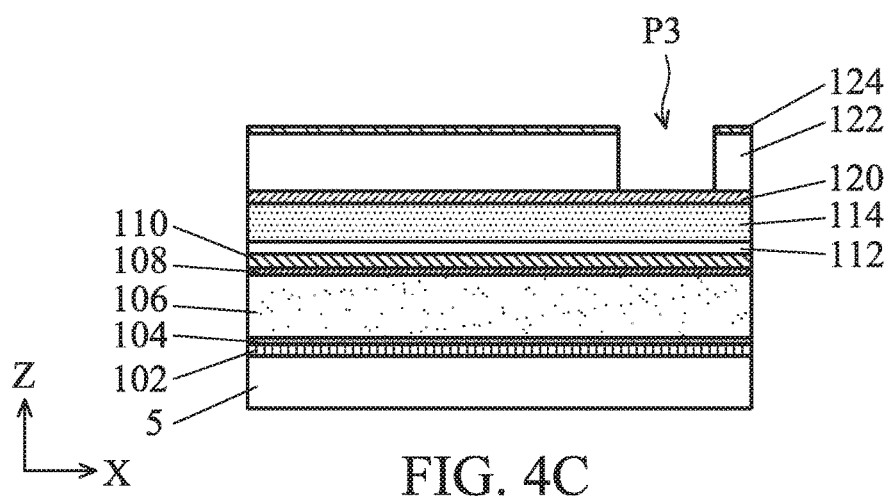
FIG. 4C is an exemplary cross sectional view corresponding to line X2-X2 of FIG. 4A, according to some embodiments of the present disclosure.
Figure 5A:
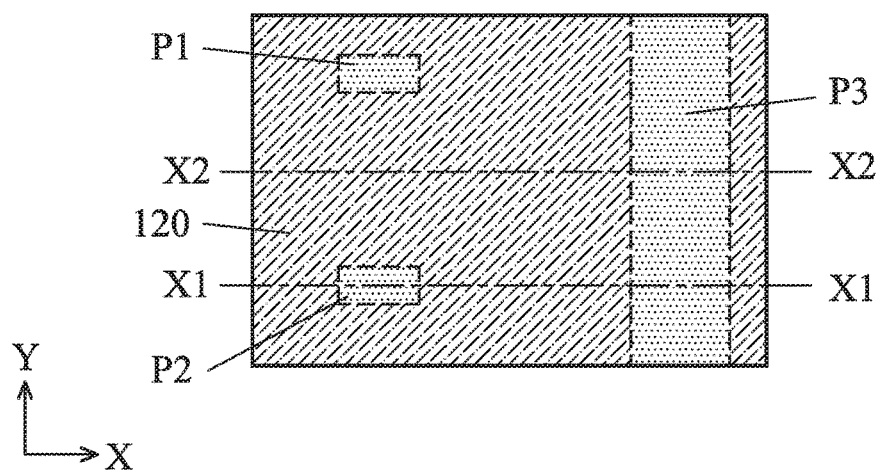
FIG. 5A is an exemplary plan view (top view) of one of the various stages of a sequential semiconductor device manufacturing process.
Figure 5B:
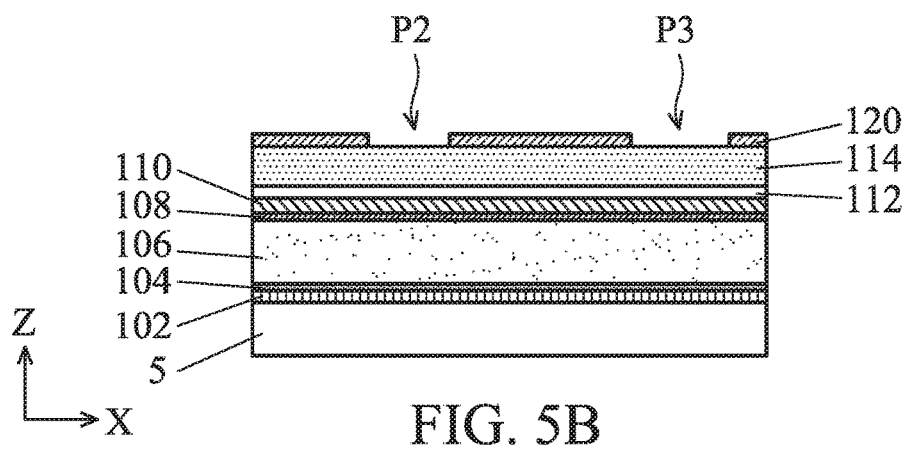
FIG. 5B is an exemplary cross sectional view corresponding to line X1-X1 of FIG. 5A.
Figure 5C:
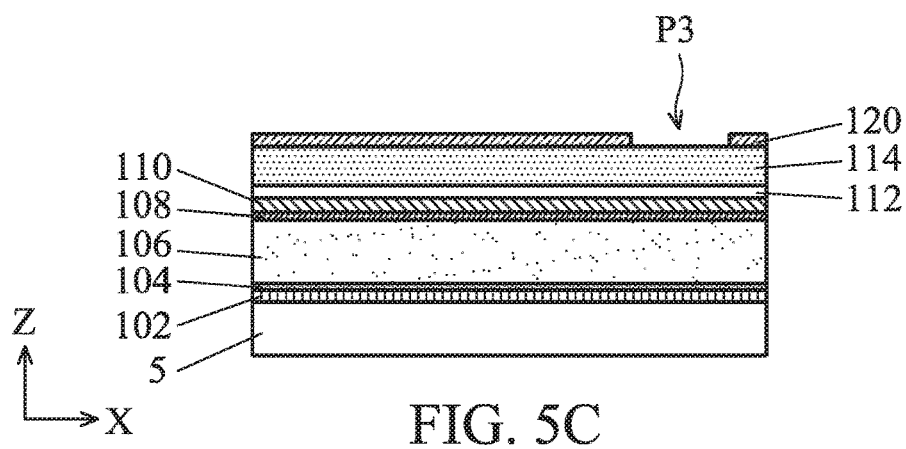
FIG. 5C is an exemplary cross sectional view corresponding to line X2-X2 of FIG. 5A, according to some embodiments of the present disclosure.

By using the first resist pattern 126 as an etching mask, the first upper and lower mask layers 124, 122 are patterned as shown in FIGS. 4A-4C. Then, the first resist pattern 126 is removed, and the second cap layer 120 is patterned by using the patterns first upper and lower mask layers, as shown in FIGS. 5A-5C. The patterning of each layer is performed by a suitable dry etching operation. By this etching, the opening patterns P1-P3 are transferred into the second cap layer 120. The first mask layer is then removed.

The widths S1 and S2 of the opening patterns P1 and P2 in the Y direction are in a range from about 5 nm to about 20 nm in some embodiments. The length of the opening patterns P1 and P2 in the X direction is about 30 nm to about 2 μm in some embodiments. The pitch L1 of the opening patterns P1 and P2 in the Y direction is in a range from about 10 nm to about 40 nm in some embodiments.

The width S3 of the opening pattern P3 in the X direction is in a range from about 40 nm to about 100 nm in some embodiments. The length of the opening pattern P3 in the Y direction is about 100 nm to about 10 μm in some embodiments.

Figure 6A:
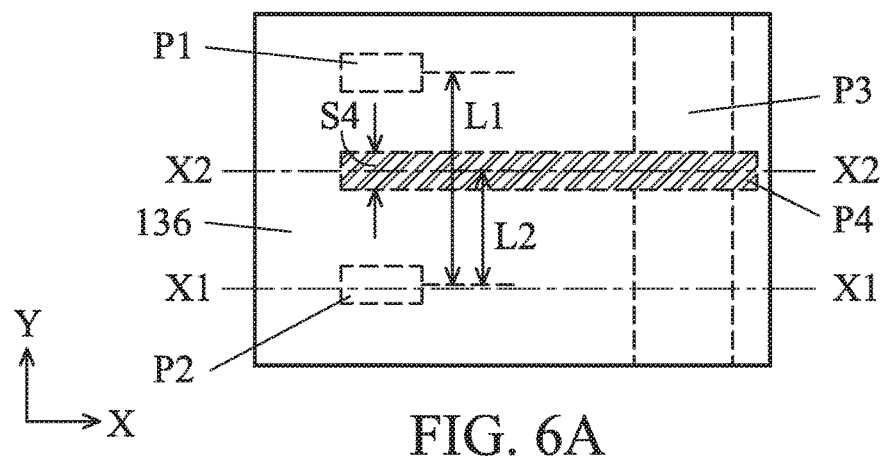
FIG. 6A is an exemplary plan view (top view) of one of the various stages of a sequential semiconductor device manufacturing process.
Figure 6B:
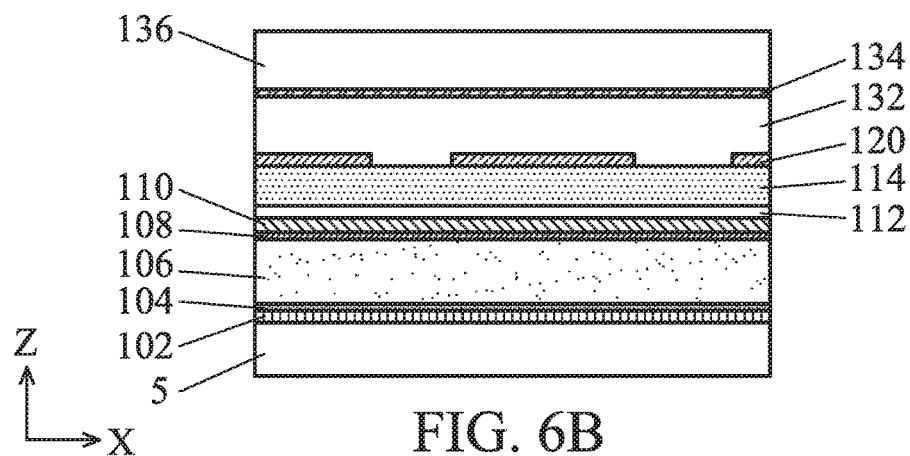
FIG. 6B is an exemplary cross sectional view corresponding to line X1-X1 of FIG. 6A.
Figure 6C:
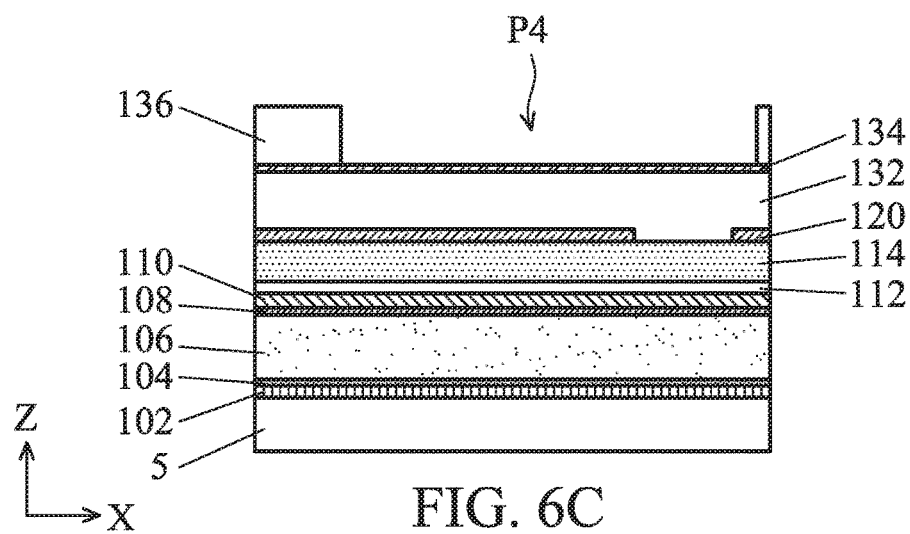
FIG. 6C is an exemplary cross sectional view corresponding to line X2-X2 of FIG. 6A, according to some embodiments of the present disclosure.

Then, a second mask layer including a second lower mask layer 132 and a second upper mask layer 134 are formed over the patterned second cap layer, and a second resist pattern 136 having a fourth opening P4 is formed on the second mask layer, as shown in FIGS. 6A-6C. The materials and/or configuration of the second upper and lower mask layers 134, 132 are the same as those of the first upper and lower mask layers 124, 122. As shown in FIG. 6A, the opening pattern P4 partially overlaps the third opening P3.

The width S4 of the opening pattern P4 in the Y direction is in a range from about 5 nm to about 20 nm in some embodiments. The length of the opening pattern P4 in the X direction is about 50 nm to about 2 μm in some embodiments. The opening pattern P4 is located at the center of the opening patterns P1 and P2, and the pitch L2 of the opening patterns P2 (or P1) and P4 in the Y direction is in a range from about 5 nm to about 20 nm in some embodiments.

Figure 7A:
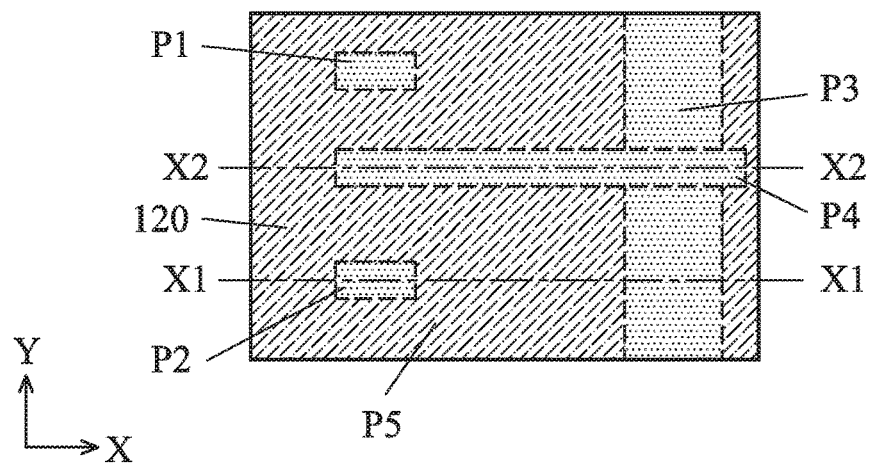
FIG. 7A is an exemplary plan view (top view) of one of the various stages of a sequential semiconductor device manufacturing process.
Figure 7B:
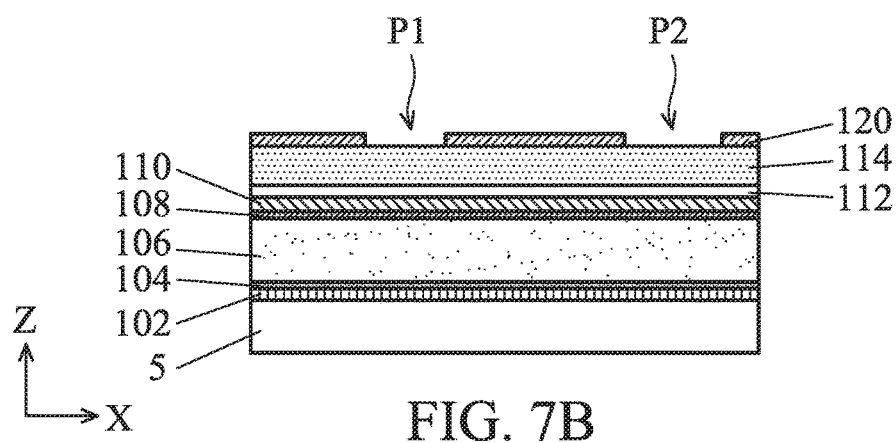
FIG. 7B is an exemplary cross sectional view corresponding to line X1-X1 of FIG. 7A.
Figure 7C:
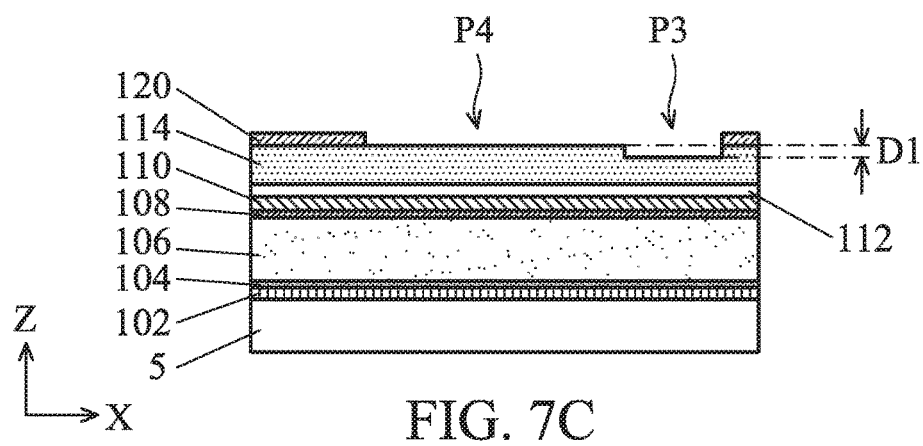
FIG. 7C is an exemplary cross sectional view corresponding to line X2-X2 of FIG. 7A, according to some embodiments of the present disclosure.

By using the second resist pattern 136 as an etching mask, the second cap layer 120 is further patterned, as shown in FIGS. 7A-7C. By this etching, the opening pattern P4 is transferred into the second cap layer 120.

In this etching, at the stitching portion where the third opening pattern P3 and the fourth opening pattern P4 overlaps with each other, the intermediate layer 114 is slightly etched, as shown in FIG. 7C. The etched amount D1 in the intermediate layer 114 is in a range from about 0.5 nm to about 10 nm in some embodiments. Even though the intermediate layer 114 is etched, the etching does not reach the first cap layer 112. If the second cap layer 120 is not used, the etching of the intermediate layer 114 may damage one or more layers below the intermediate layer 114 at the stitching portion.

In some embodiments of the present disclosure, by using the patterned second cap layer 120 as an etching mask, the intermediate layer 114 and the first cap layer are patterned, and then by using the patterned intermediate layer as an etching mask, the first cap layer 112 is patterned. Subsequently, by using the patterned first cap layer 112 as an etching mask, the nitride layer 110 is patterned, and then the layers 108, 106, 104 and 102 are patterned, thereby forming through-patterns over the first ILD layer 5. In other embodiments, by using the patterned intermediate layer as an etching mask, the first cap layer and the nitride layer 110 are patterned, and then the layers 108, 106, 104 and 102 are patterned, thereby forming through-patterns over the first ILD layer 5.

Figure 8A:
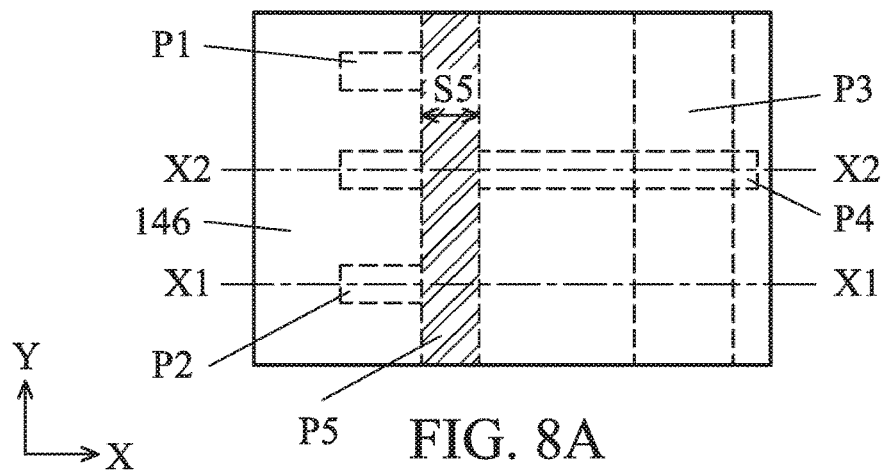
FIG. 8A is an exemplary plan view (top view) of one of the various stages of a sequential semiconductor device manufacturing process.
Figure 8B:
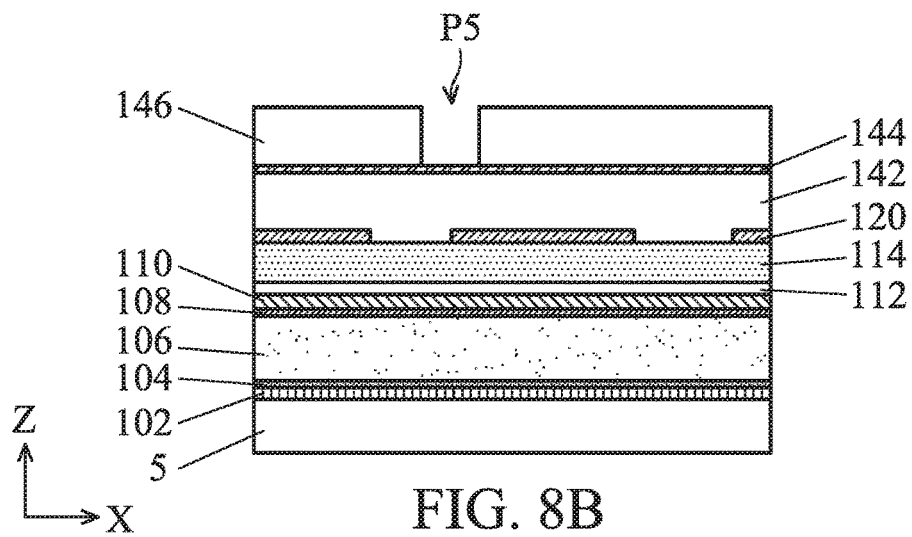
FIG. 8B is an exemplary cross sectional view corresponding to line X1-X1 of FIG. 8A.
Figure 8C:
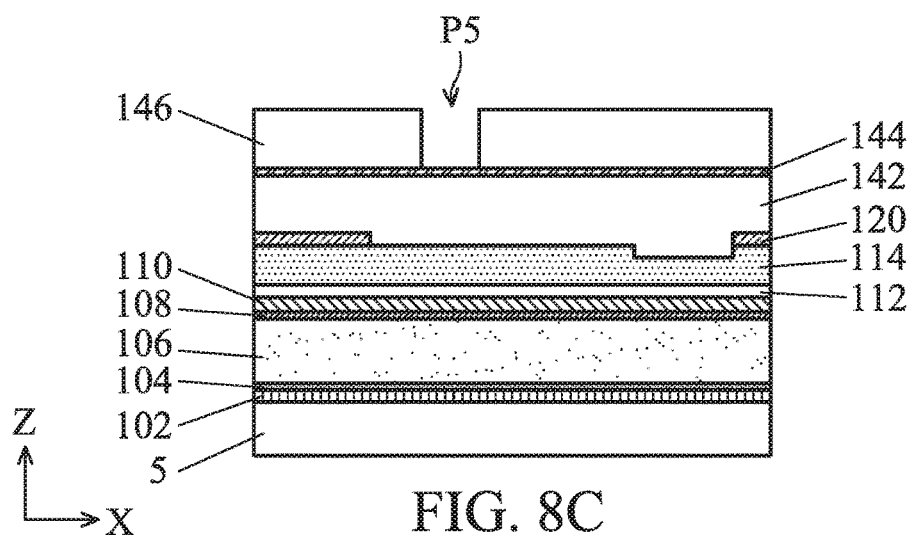
FIG. 8C is an exemplary cross sectional view corresponding to line X2-X2 of FIG. 8A, according to some embodiments of the present disclosure.

In other embodiments, after the structures of FIGS. 7A-7C are formed, a third mask layer including a third lower mask layer 142 and a third upper mask layer 144 are formed over the patterned second cap layer 120, and a third resist pattern 146 having a fifth opening P5 is formed on the third mask layer, as shown in FIGS. 8A-8C. The materials and/or configuration of the third upper and lower mask layers 144, 142 are the same as those of the first upper and lower mask layers 124, 122. As shown in FIG. 8A, the fifth opening pattern P5 partially overlaps the first, second and fourth openings.

The width S5 of the opening pattern P5 in the X direction are in a range from about 20 nm to about 50 nm in some embodiments. The length of the opening pattern P5 in the Y direction is about 100 nm to about 10 μm in some embodiments.

Figure 9A:
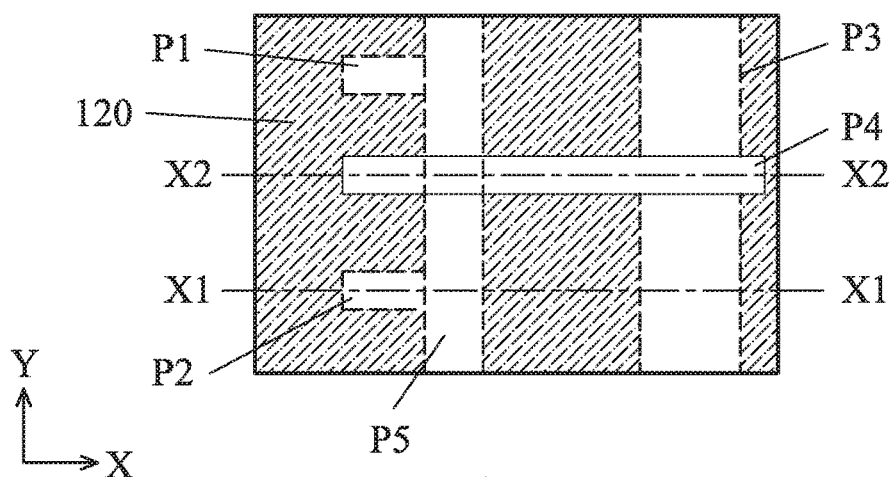
FIG. 9A is an exemplary plan view (top view) of one of the various stages of a sequential semiconductor device manufacturing process.
Figure 9B:
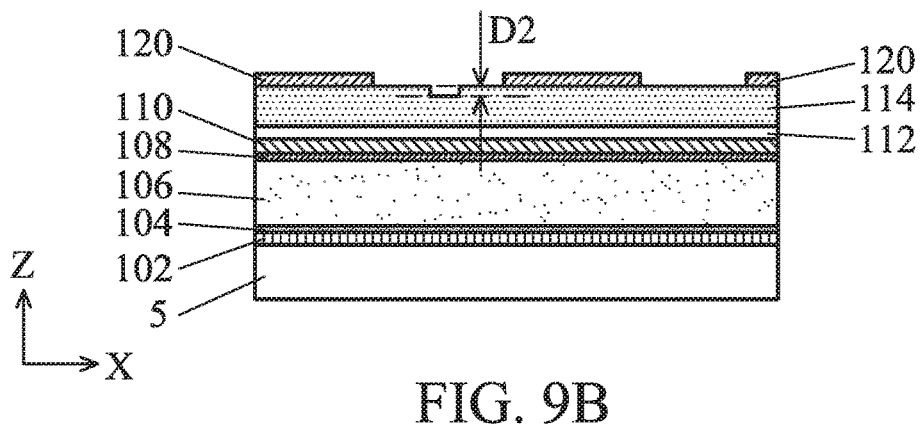
FIG. 9B is an exemplary cross sectional view corresponding to line X1-X1 of FIG. 9A.
Figure 9C:
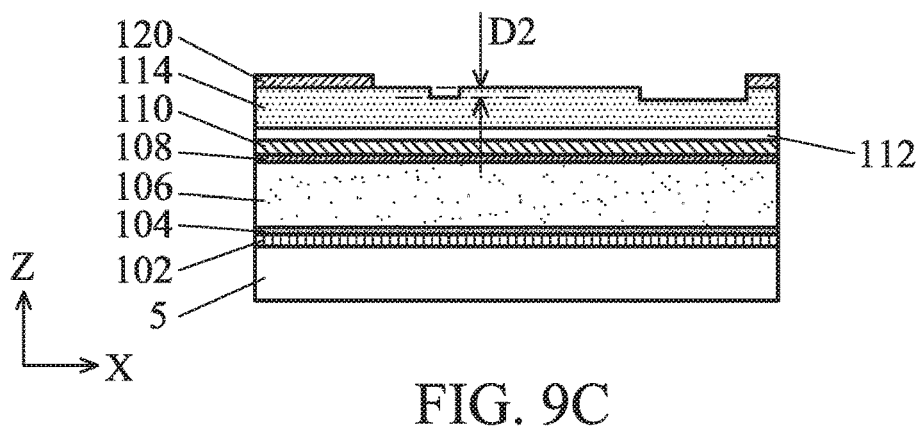
FIG. 9C is an exemplary cross sectional view corresponding to line X2-X2 of FIG. 9A, according to some embodiments of the present disclosure.

By using the third resist pattern 146 as an etching mask, the third upper and lower mask layers 144, 142 are patterned, and then the second cap layer 120 is patterned, as shown in FIGS. 9A-9C. The patterning of each layer is performed by a suitable dry etching operation. By this etching, the opening pattern P5 is transferred into the second cap layer 120. The third mask layer is then removed.

In this etching, at the stitching portion where the fifth opening pattern P5 overlaps the first, second and fourth opening patterns, the intermediate layer 114 is slightly etched, as shown in FIGS. 9B and 9C. The etched amount D2 in the intermediate layer 114 is in a range from about 0.5 nm to about 10 nm in some embodiments. Even though the intermediate layer 114 is etched, the etching does not reach the first cap layer 112.

Figure 10A:
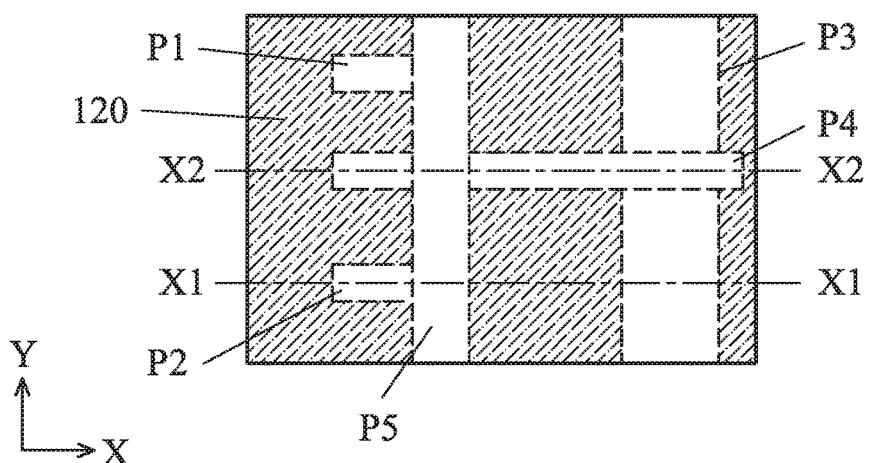
FIG. 10A is an exemplary plan view (top view) of one of the various stages of a sequential semiconductor device manufacturing process.
Figure 10B:
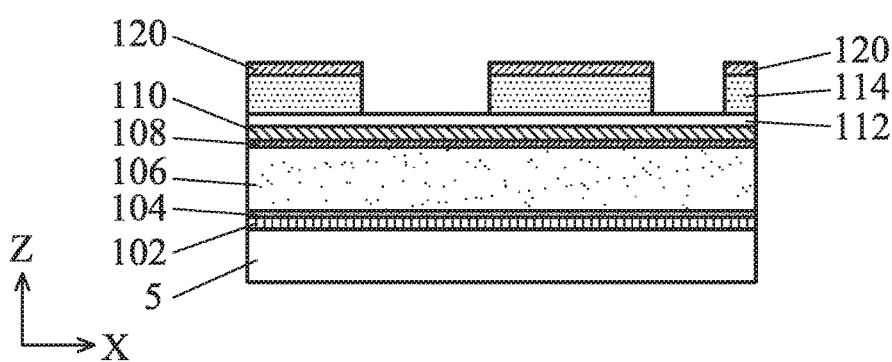
FIG. 10B is an exemplary cross sectional view corresponding to line X1-X1 of FIG. 10A.
Figure 10C:
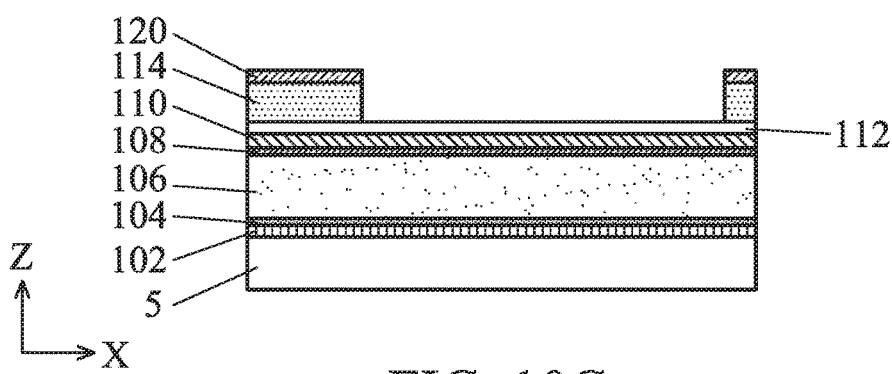
FIG. 10C is an exemplary cross sectional view corresponding to line X2-X2 of FIG. 10A, according to some embodiments of the present disclosure.

Subsequently, by using the patterned second cap layer 120 as an etching mask, the intermediate layer 114 is patterned, as shown in FIGS. 10A-10C. This etching substantially stops at the first cap layer 112. The transferred pattern shape is the combination (overlapped portion) of the first to fifth opening patterns P1-P5.

In some embodiments, by using the patterned second cap layer 120 and intermediate layer 114 as an etching mask, the first cap layer 112 and the nitride layer 110 are patterned, and then the layers 108, 106, 104 and 102 are patterned, thereby forming through-patterns over the first ILD layer 5. Then, the through-patterns are filled by conductive material, such as Al, Cu, W, Co, or Ni.

Figure 11A:
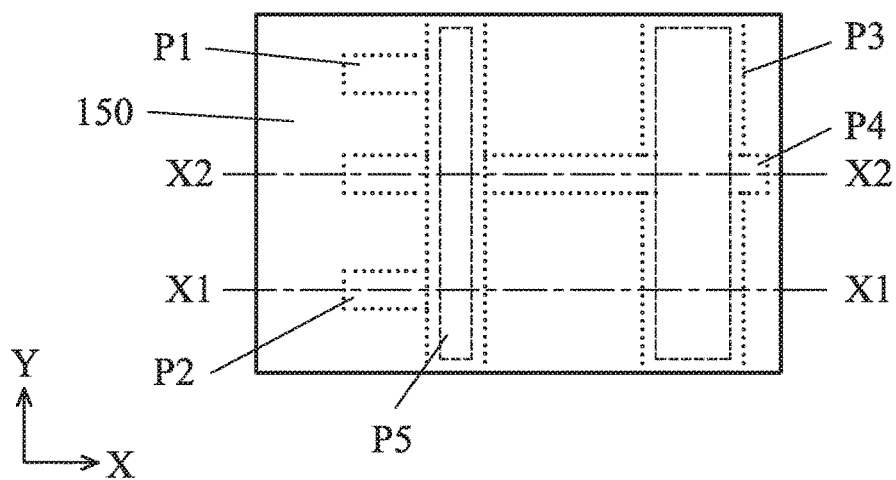
FIG. 11A is an exemplary plan view (top view) of one of the various stages of a sequential semiconductor device manufacturing process.
Figure 11B:
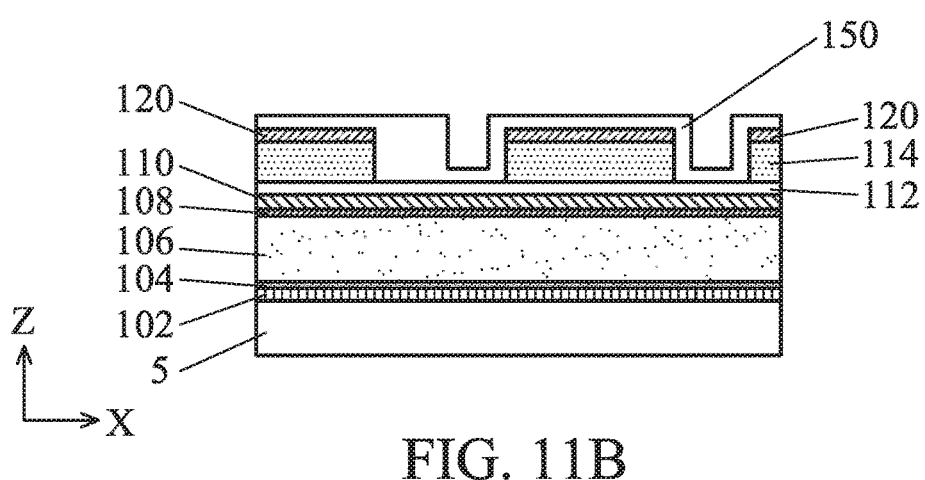
FIG. 11B is an exemplary cross sectional view corresponding to line X1-X1 of FIG. 11A.
Figure 11C:
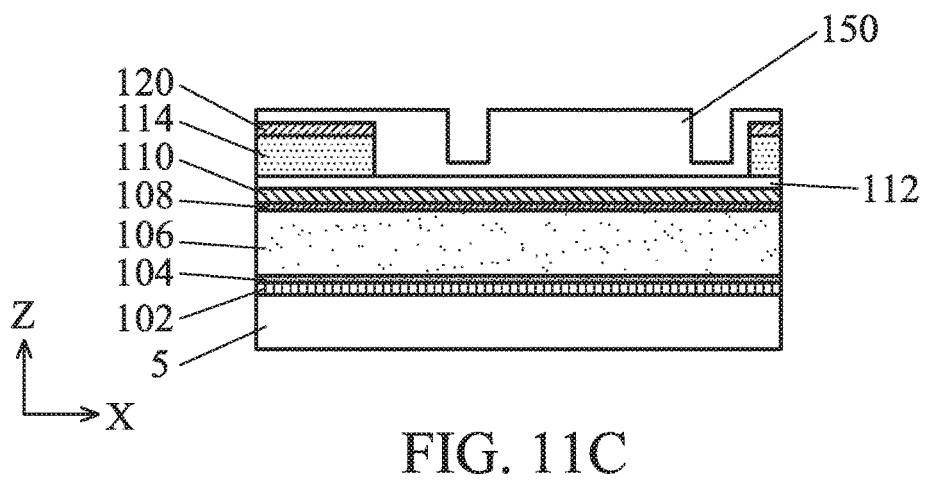
FIG. 11C is an exemplary cross sectional view corresponding to line X2-X2 of FIG. 11A, according to some embodiments of the present disclosure.
Figure 12A:
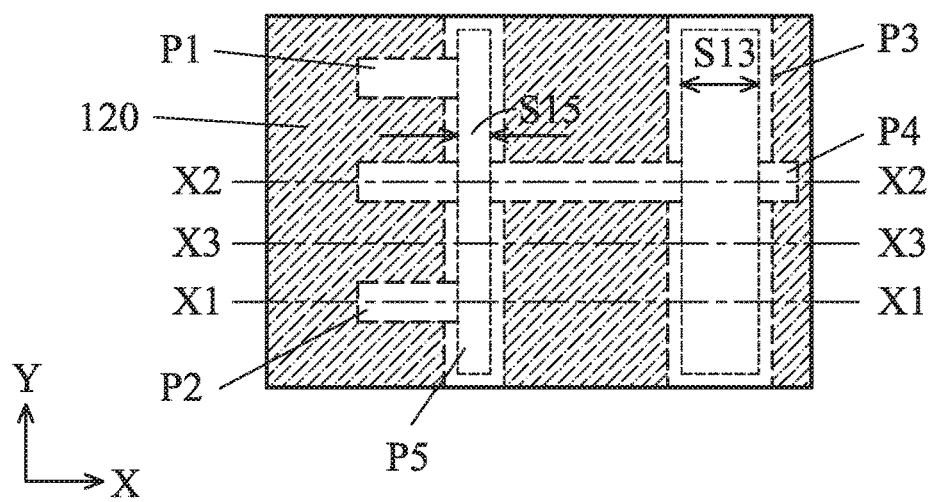
FIG. 12A is an exemplary plan view (top view) of one of the various stages of a sequential semiconductor device manufacturing process.
Figure 12B:
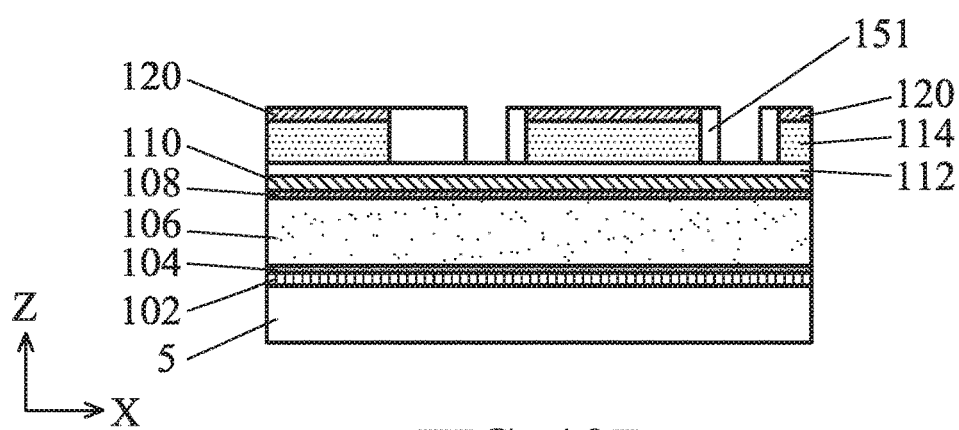
FIG. 12B is an exemplary cross sectional view corresponding to line X1-X1 of FIG. 12A.
Figure 12C:
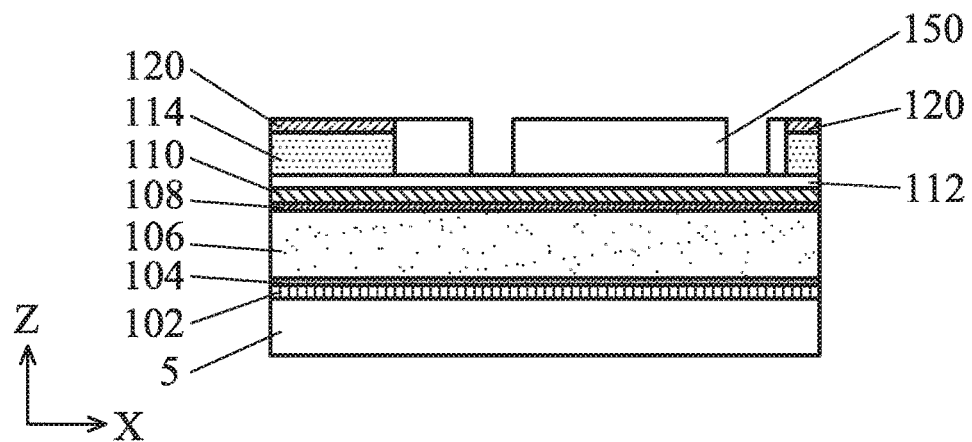
FIG. 12C is an exemplary cross sectional view corresponding to line X2-X2 of FIG. 12A
Figure 12D:
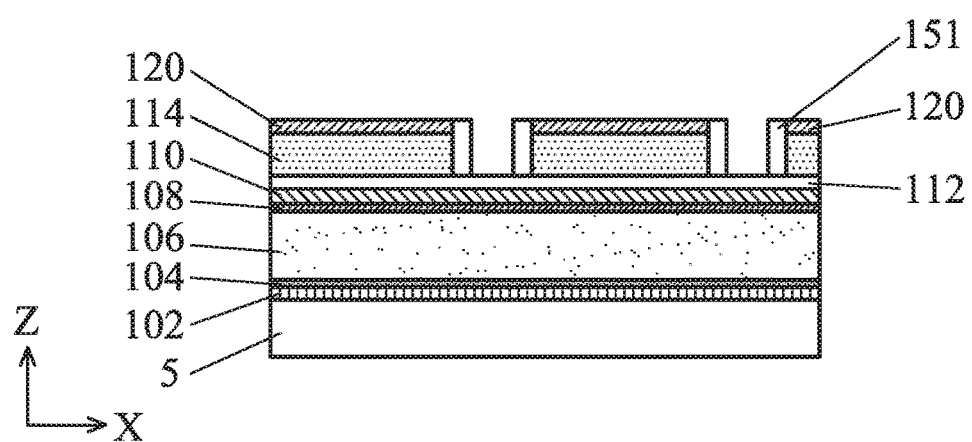
FIG. 12D is an exemplary cross sectional view corresponding to line X3-X3 of FIG. 12A, according to some embodiments of the present disclosure.

In other embodiments, as shown in FIGS. 11A-11C, a spacer layer 150 is formed over the structure of FIGS. 10A-10C. The spacer layer 150 is made of a titanium oxide, tungsten oxide, hafnium oxide, zirconium oxide, silicon oxide, silicon nitride, silicon oxynitride (SiON), SiOCN, fluorine-doped silicate glass (FSG), or a low-K dielectric material, or any other suitable dielectric material. The thickness of the spacer layer 150 is in a range from about 5 nm to about 40 nm in some embodiments. The spacer layer 150 can be formed by CVD, ALD or a spin-on technology.

Further, anisotropic etching is performed, thereby forming sidewall spacer layers 151. At the portion where the opening size is relatively large, the spacer layer 150 remains as a bulk pattern, as shown in FIGS. 12A-12D.

After the sidewall spacer layers are formed, the space S13 of the opening pattern P3 and the space S15 of the opening pattern P5 are shrunk. The space S13 of the opening pattern P3 is in a range from about 20 nm to about 70 nm in some embodiments. The space S15 of the opening pattern P5 is in a range from about 10 nm to about 30 nm in some embodiments.

Figure 13A:
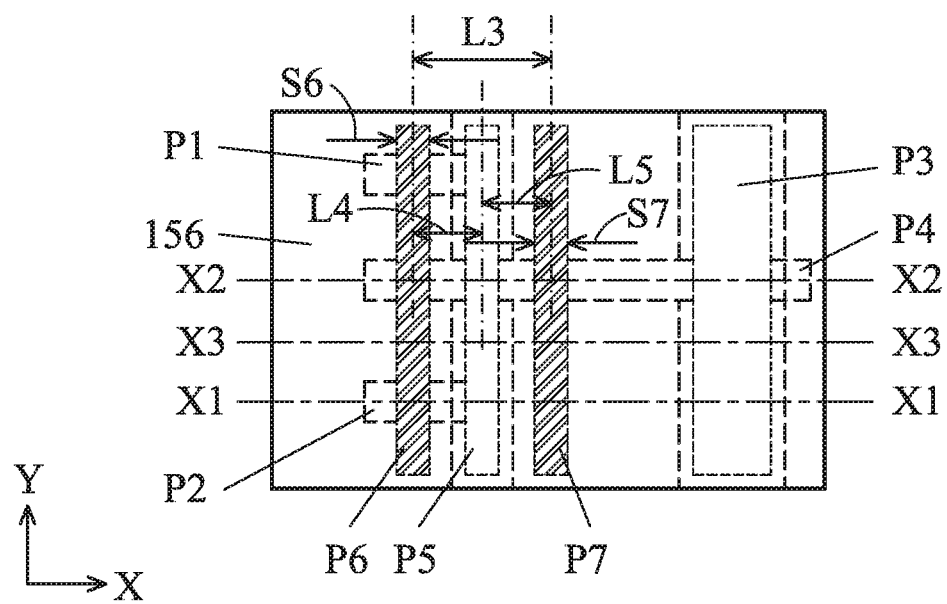
FIG. 13A is an exemplary plan view (top view) of one of the various stages of a sequential semiconductor device manufacturing process.
Figure 13B:
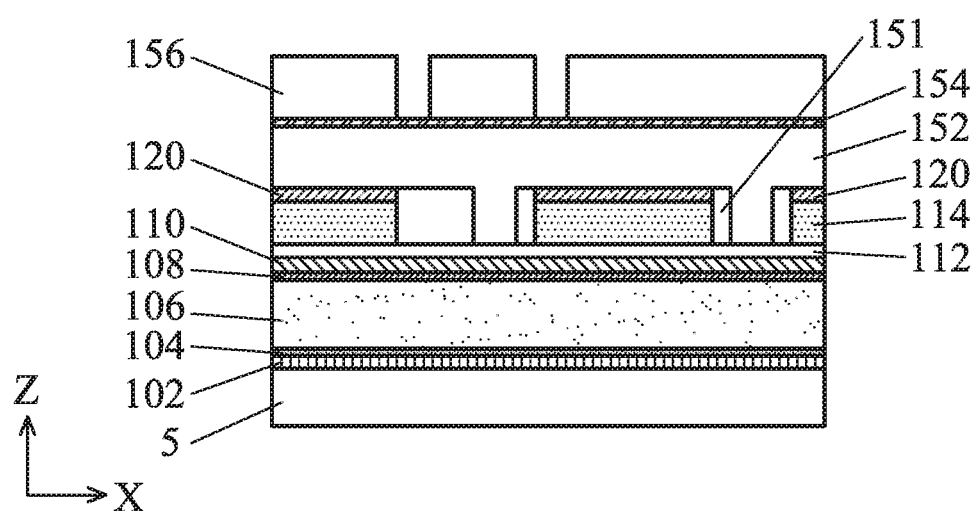
FIG. 13B is an exemplary cross sectional view corresponding to line X1-X1 of FIG. 13A.
Figure 13C:
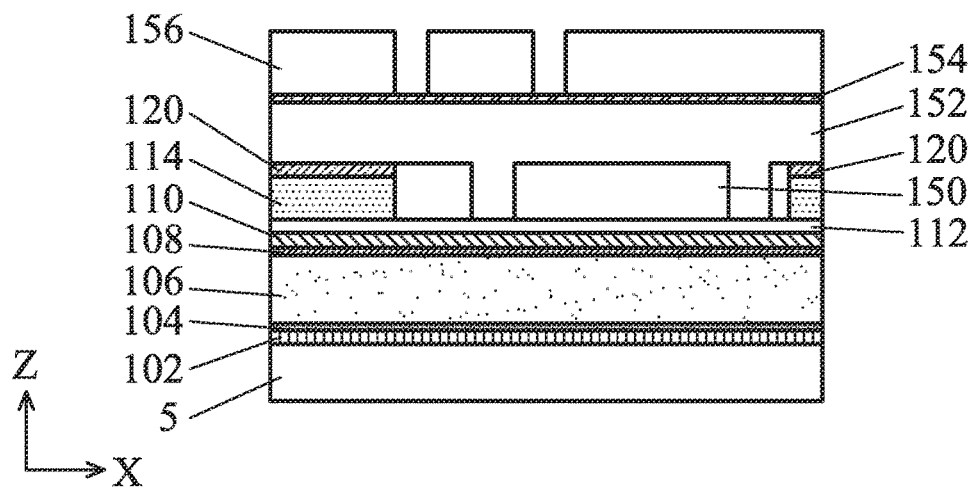
FIG. 13C is an exemplary cross sectional view corresponding to line X2-X2 of FIG. 13A
Figure 13D:
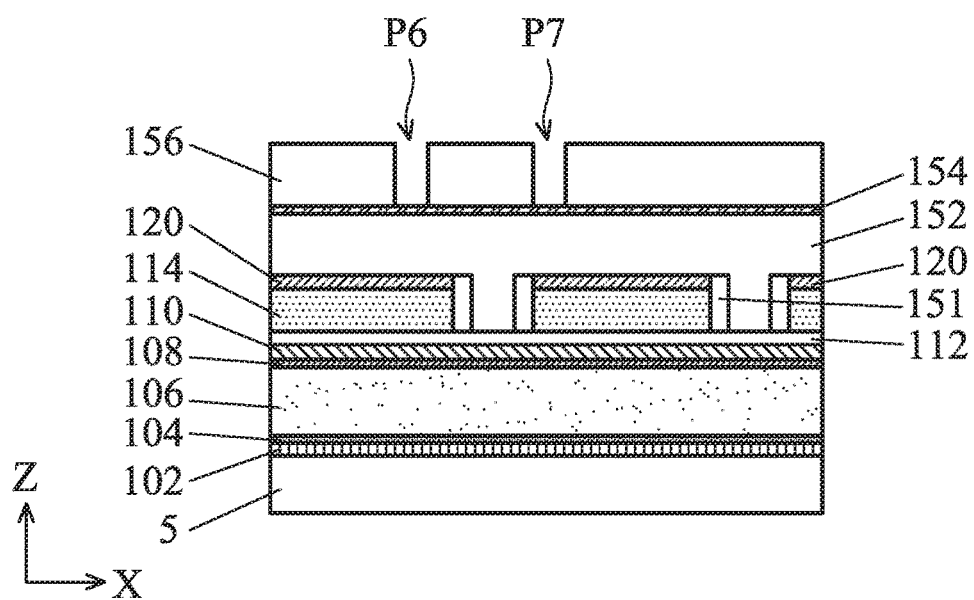
FIG. 13D is an exemplary cross sectional view corresponding to line X3-X3 of FIG. 13A, according to some embodiments of the present disclosure.
Figure 14A:
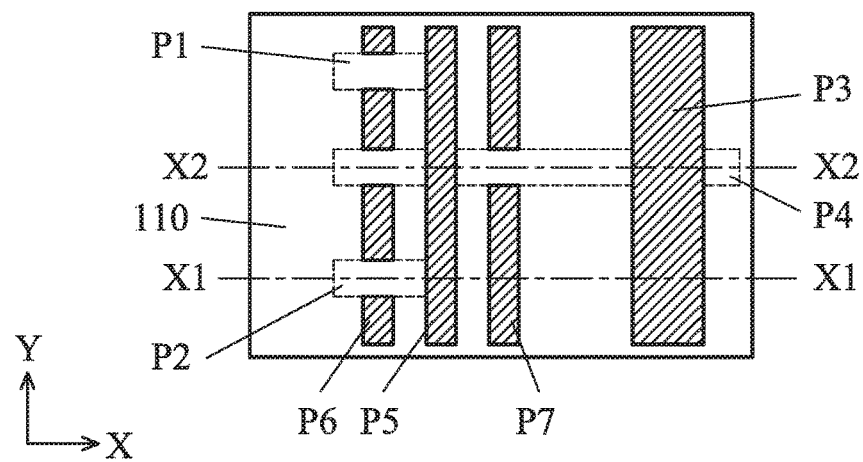
FIG. 14A is an exemplary plan view (top view) of one of the various stages of a sequential semiconductor device manufacturing process.
Figure 14B:
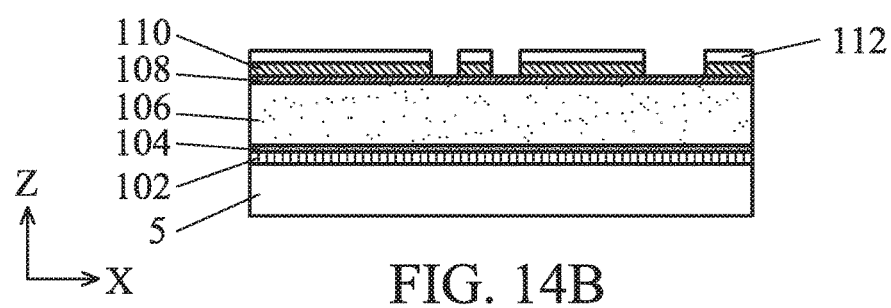
FIG. 14B is an exemplary cross sectional view corresponding to line X1-X1 of FIG. 14A.
Figure 14C:
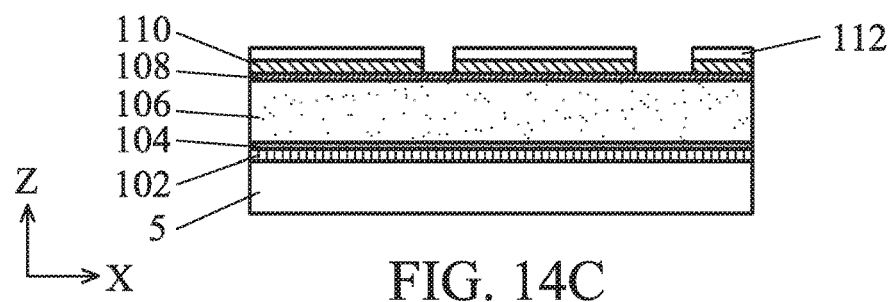
FIG. 14C is an exemplary cross sectional view corresponding to line X2-X2 of FIG. 14A
Figure 14D:
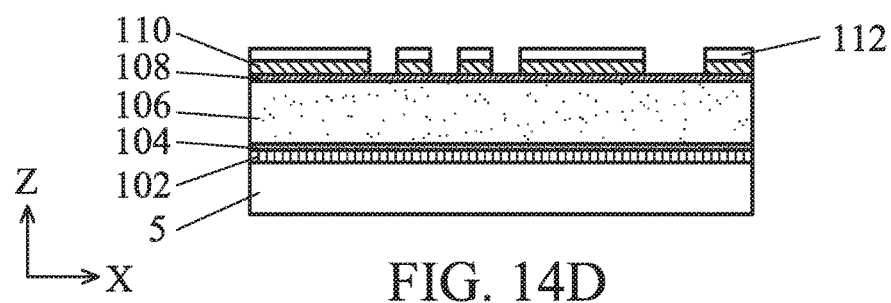
FIG. 14D is an exemplary cross sectional view corresponding to line X3-X3 of FIG. 14A, according to some embodiments of the present disclosure.

Then, a fourth mask layer including a fourth lower mask layer 152 and a fourth upper mask layer 154 are formed over the spacer layers 150, 151 and the patterned second cap layer 120, and a fourth resist pattern 156 having a sixth opening P6 and a seventh opening P7 is formed on the fourth mask layer, as shown in FIG. 13A-13D. The materials and/or configuration of the fourth upper and lower mask layers 154, 152 are the same as those of the first upper and lower mask layers 124, 122. As shown in FIG. 13A, the sixth opening pattern P6 partially overlaps the first, second and fourth openings, and the seventh opening pattern P7 partially overlaps the fourth opening.

The widths S6 and S7 of the opening patterns P6 and P7 in the X direction are equal to each other, and are in a range from about 10 nm to about 30 nm in some embodiments. The length of the opening patterns P6 and P7 in the Y direction is about 100 nm to about 10 µm in some embodiments. The pitch L3 of the opening patterns P6 and P7 in the X direction is in a range from about 10 nm to about 40 nm in some embodiments.

The space S15 of the opening pattern P5 substantially equal to the widths S6 and S7. The opening patterns P6 and P7 are formed so that the opening pattern P5 is located at the center of the opening patterns P6 and P7. The pitches L4 and L5 of the opening patterns P6 and P7 and the opening pattern P5 in the X direction is in a range from about 50 nm to about 20 nm in some embodiments.

By using the fourth resist pattern 156 as an etching mask, the fourth upper and lower mask layers 154, 152 are patterned, and then the second cap layer 120 and the intermediate layer 114 are patterned. The patterning of each layer is performed by a suitable dry etching operation. By this etching, the opening patterns P6 and P7 are transferred into the second cap layer 120. The fourth mask layer is then removed.

Then, using the patterned second cap layer 120 and intermediate layer 114 as an etching mask, the first cap layer 112 and the nitride layer 110 are patterned, as shown in FIGS. 14A-14D.

Figure 15A:
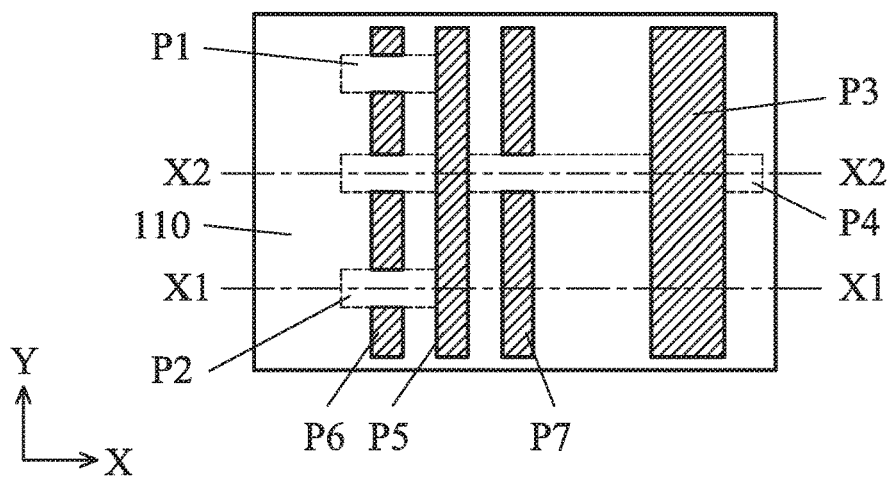
FIG. 15A is an exemplary plan view (top view) of one of the various stages of a sequential semiconductor device manufacturing process.
Figure 15B:
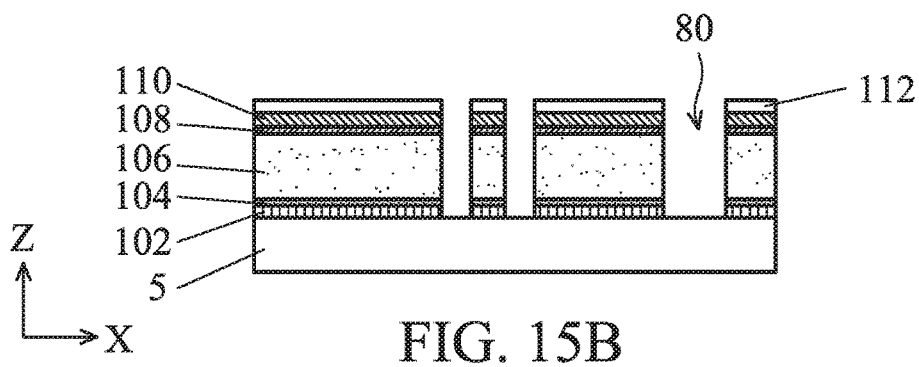
FIG. 15B is an exemplary cross sectional view corresponding to line X1-X1 of FIG. 15A.
Figure 15C:
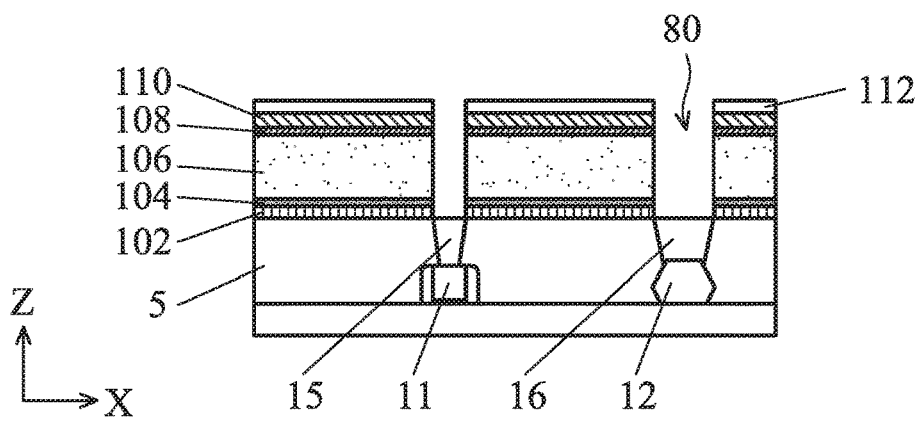
FIG. 15C is an exemplary cross sectional view corresponding to line X2-X2 of FIG. 15A, according to some embodiments of the present disclosure.

Subsequently, the layers 108, 106, 104 and 102 are patterned, thereby forming through-patterns 80 over the first ILD layer 5, as shown in FIGS. 15A-15C. FIG. 15C illustrates the underlying devices 10 (e.g., FETs) formed on the substrate 1. As shown in FIG. 15C, a contact 15 is formed over a gate 11 of an FET and a contact 16 is formed on a source/drain 12 of an FET in some embodiments. The through-patterns 80 are formed over the contacts 15 and 16.

Figure 16A:
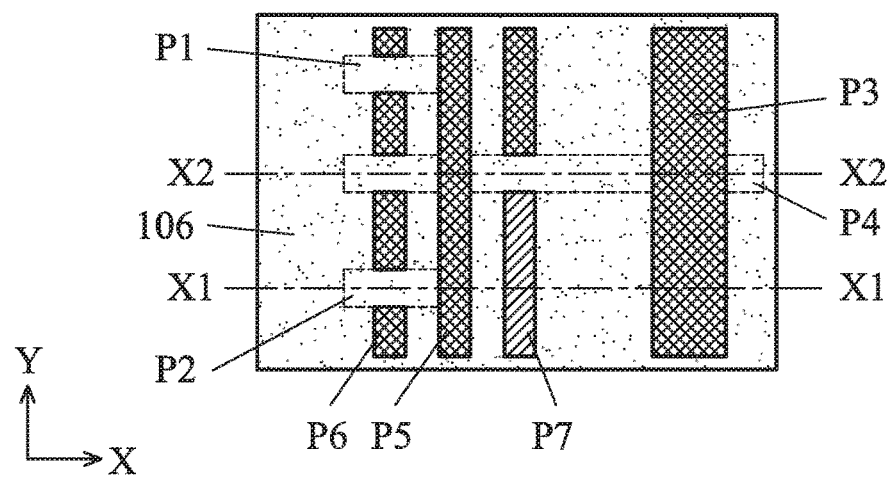
FIG. 16A is an exemplary plan view (top view) of one of the various stages of a sequential semiconductor device manufacturing process.
Figure 16B:
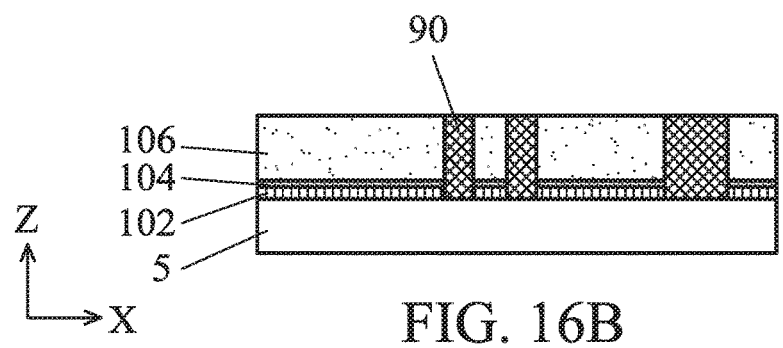
FIG. 16B is an exemplary cross sectional view corresponding to line X1-X1 of FIG. 16A.
Figure 16C:
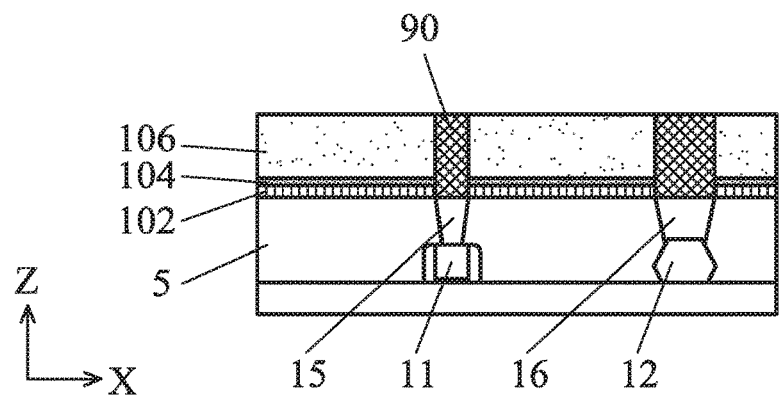
FIG. 16C is an exemplary cross sectional view corresponding to line X2-X2 of FIG. 16A, according to some embodiments of the present disclosure.

Then, the through-patterns 80 are filled by conductive material, such as Al, Cu, W, Co, or Ni as shown in FIGS. 16A-16C. A conductive material is deposited by CVD, ALD, PVD, electroplating or any other suitable film formation method, and the deposited conductive material is subsequently planarized by a CMP operation or etch-back operation. During planarization, the first cap layer 112, the nitride layer 110 and the second liner layer 108 are removed in some embodiments.

It is understood that the structure shown in FIGS. 16A-16C undergoes further CMOS processes to form various features such as interconnect vias, interconnect metal layers, passivation layers, etc.

The various embodiments or examples described herein offer several advantages over the existing art. In the present disclosure, an amorphous layer is sandwiched by a silicon oxide based dielectric layer and a silicon nitride based dielectric layer. Accordingly, it is possible to prevent damage in the amorphous layer at a region where multiple patterning processes are performed. Thus, it is also possible to improve a yield of the semiconductor device manufacturing, and a reliability of conductive wiring patterns.

One embodiment of the disclosure is a pattern forming method for a semiconductor device. In the method, a stacked structure is formed. The stacked structure includes a bottom layer, a middle layer disposed over the bottom layer and a first mask layer disposed over the middle layer over a semiconductor substrate. The middle layer includes a first cap layer disposed over the bottom layer, an intermediate layer disposed over the first cap layer and a second cap layer disposed over the intermediate layer. The first mask layer is patterned by using a first resist pattern as an etching mask. The second cap layer is first-patterned by using the patterned first mask layer as an etching mask. A second mask layer is formed over the first-patterned second cap layer. The second mask layer is patterned by using a second resist pattern as an etching mask. The first-patterned second cap layer is second-patterned by using the patterned second mask layer as an etching mask. The intermediate layer and the first cap layer are patterned by using the second-patterned second cap layer as an etching mask. The bottom layer is patterned by using the patterned first cap layer as an etching mask.

Another embodiment of the disclosure is a pattern forming method for a semiconductor device. In the method, a stacked structure is formed. The stacked structure includes a bottom layer, a middle layer disposed over the bottom layer and a first mask layer disposed over the middle layer over a semiconductor substrate. The middle layer includes a first cap layer disposed over the bottom layer, an intermediate layer disposed over the first cap layer and a second cap layer disposed over the intermediate layer. The first mask layer is patterned by using a first resist pattern formed on the first mask layer as an etching mask. The second cap layer is first-patterned by using the patterned first mask layer as an etching mask. A second mask layer is formed over the first-patterned second cap layer. The second mask layer is patterned by using a second resist pattern formed on the second mask layer as an etching mask. The first-patterned second cap layer is second-patterned by using the patterned second mask layer as an etching mask. A third mask layer is formed over the second-patterned second cap layer. The third mask layer is patterned by using a third resist pattern formed on the third mask layer as an etching mask. The second-patterned second cap layer is third-patterned by using the patterned third mask layer as an etching mask. The intermediate layer and the first cap layer are patterned by using the third-patterned second cap layer as an etching mask. The bottom layer is patterned by using the patterned first cap layer as an etching mask.

In another embodiment of the disclosure, in a pattern forming method for a semiconductor device, a stacked structure is formed. The stacked structure includes a bottom layer, a middle layer disposed over the bottom layer and a first mask layer disposed over the middle layer over a semiconductor substrate. The middle layer includes a first cap layer disposed over the bottom layer, an intermediate layer disposed over the first cap layer and a second cap layer disposed over the intermediate layer. The first mask layer is patterned by using a first resist pattern as an etching mask. The second cap layer is first-patterned by using the patterned first mask layer as an etching mask. A second mask layer is formed over the first-patterned second cap layer. The second mask layer is patterned by using a second resist pattern as an etching mask. The first-patterned second cap layer is second-patterned by using the patterned second mask layer as an etching mask. The intermediate layer and the first cap layer are patterned by using the second-patterned second cap layer as an etching mask. A bulk spacer layer is formed in the patterned intermediate and first cap layers, and sidewall spacers are formed on sidewalls of the patterned intermediate and first cap layers. A third mask layer is formed over the second-patterned second cap layer, the bulk spacer layer and the sidewall spacers. The third mask layer is patterned by using a third resist pattern formed on the third mask layer as an etching mask. The second-patterned second cap layer is third-patterned by using the patterned third mask layer as an etching mask. The intermediate layer and the first cap layer are patterned by using the third-patterned second cap layer as an etching mask. The bottom layer is patterned by using the patterned first cap layer as an etching mask.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pattern forming method for a semiconductor device, the pattern forming method comprising:
 forming, over a semiconductor substrate, a stacked structure of a bottom layer, a middle layer disposed over the bottom layer and a first mask layer disposed over the middle layer, the middle layer including a first cap layer disposed over the bottom layer, an intermediate layer disposed over the first cap layer and a second cap layer disposed over the intermediate layer;
 patterning the first mask layer by using a first resist pattern as an etching mask;
 patterning the second cap layer by using the patterned first mask layer as an etching mask;
 forming a second mask layer over the patterned second cap layer, which has been patterned by using the patterned first mask layer;
 patterning the second mask layer by using a second resist pattern as an etching mask;
 patterning the patterned second cap layer, which has been patterned by using the patterned first mask layer, by using the patterned second mask layer as an etching mask;
 patterning the intermediate layer and the first cap layer by using the patterned second cap layer, which has been patterned by using the patterned second mask layer, as an etching mask; and
 patterning the bottom layer by using the patterned first cap layer as an etching mask, and
 forming a bulk spacer layer in the patterned intermediate and first cap layers and sidewall spacers on sidewalls of the patterned intermediate and first cap layers,
 wherein the first resist pattern and the second resist pattern extend to cross each other and have an overlapped opening portion where a part of an opening pattern of the second resist pattern overlaps a part of an opening pattern of the first resist pattern.

2. The pattern forming method of claim 1, wherein after the patterning the patterned second cap layer, which has been patterned by using the patterned first mask layer, the intermediate layer is partially etched at the overlapped opening portion.

3. The pattern forming method of claim 1, wherein the intermediate layer is made of an amorphous or a polycrystalline semiconductor material.

4. The pattern forming method of claim 3, wherein:
 the first cap layer includes a silicon oxide based material, and
 the second cap layer includes a nitride based material or a carbide based material, which is different from the first cap layer.

5. The pattern forming method of claim 3, wherein:
 the second cap layer includes a silicon oxide based material, and
 the first cap layer includes a nitride based material or a carbide based material, which is different from the second cap layer.

6. The pattern forming method of claim 1, wherein:
 the bottom layer is formed over a first interlayer dielectric layer (ILD) disposed over an underlying structure formed on the semiconductor substrate, and
 the bottom layer includes a silicon nitride based dielectric layer, a first liner layer, a second ILD layer, a second liner layer and a nitride layer.

7. The pattern forming method of claim 6, wherein the patterning the bottom layer includes:
 patterning the nitride layer by using the patterned first cap layer as the etching mask; and
 patterning the second liner layer, the second ILD layer, the first liner layer and the silicon nitride based dielectric layer, by using the patterned second cap layer and nitride layer as an etching mask.

8. The pattern forming method of claim 6, wherein:
 by patterning the bottom layer, one or more openings reaching the first ILD layer are formed, and
 a conductive material is formed in the one or more openings.

9. The pattern forming method of claim 1, wherein each of the first mask layer and the second mask layer includes a lower mask layer and an upper mask layer made of a different material than the lower mask layer.

10. The pattern forming method of claim 1, wherein:
 the first cap layer includes one or more layers of $SiO_2$, SiCO and SiOCH, and
 the second cap layer includes one or more layers of SiN, SiCN, SiC, BN and TiN.

11. A pattern forming method for a semiconductor device, the pattern forming method comprising:
 forming, over a semiconductor substrate, a stacked structure of a bottom layer, a middle layer disposed over the bottom layer and a first mask layer disposed over the middle layer, the middle layer including a first cap layer disposed over the bottom layer, an intermediate layer disposed over the first cap layer and a second cap layer disposed over the intermediate layer;
 patterning the first mask layer by using a first resist pattern formed on the first mask layer as an etching mask;
 patterning the second cap layer by using the patterned first mask layer as an etching mask;
 forming a second mask layer over the patterned second cap layer, which has been patterned by using the patterned first mask layer;
 patterning the second mask layer by using a second resist pattern formed on the second mask layer as an etching mask;
 patterning the patterned second cap layer, which has been patterned by using the patterned first mask layer, by using the patterned second mask layer as an etching mask;
 forming a third mask layer over the patterned second cap layer, which has been patterned by using the patterned second mask layer;
 patterning the third mask layer by using a third resist pattern formed on the third mask layer as an etching mask;

patterning the patterned second cap layer, which has been patterned by using the patterned second mask layer, by using the patterned third mask layer as an etching mask;

patterning the intermediate layer and the first cap layer by using the patterned second cap layer, which has been patterned by using the patterned third mask layer, as an etching mask; and patterning the bottom layer by using the patterned first cap layer as an etching mask, and forming a bulk spacer layer in the patterned intermediate and first cap layers and sidewall spacers on sidewalls of the patterned intermediate and first cap layers, wherein the first resist pattern and the second resist pattern extend to cross each other and have a first overlapped opening portion where a part of an opening pattern of the second resist pattern overlaps a part of an opening pattern of the first resist pattern.

12. The pattern forming method of claim 11, wherein:
the first resist pattern and the third resist pattern have a second overlapped opening portion where a part of an opening pattern of the third resist pattern overlaps a part of the opening pattern of the first resist pattern, and
the second resist pattern and the third resist pattern have a third overlapped opening portion where a part of the opening pattern of the second resist pattern overlaps a part of the opening pattern of the third resist pattern.

13. The pattern forming method of claim 11, wherein:
after the patterning the patterned second cap layer by using the patterned second mask layer, the intermediate layer is partially etched at the first overlapped opening portion, and
after the patterning the patterned second cap layer by using the patterned third mask layer, the intermediate layer is partially etched at the first and second overlapped opening portions.

14. The pattern forming method of claim 11, wherein the intermediate layer is made of an amorphous or a polycrystalline semiconductor material.

15. The pattern forming method of claim 14, wherein:
the first cap layer includes a silicon oxide based material, and
the second cap layer includes a nitride based material or a carbide based material, which is different from the first cap layer.

16. The pattern forming method of claim 14, wherein:
the second cap layer includes a silicon oxide based material, and
the first cap layer includes a nitride based material or a carbide based material, which is different from the second cap layer.

17. A pattern forming method for a semiconductor device, the pattern forming method comprising:
forming, over a semiconductor substrate, a stacked structure of a bottom layer, a middle layer disposed over the bottom layer and a first mask layer disposed over the middle layer, the middle layer including a first cap layer disposed over the bottom layer, an intermediate layer disposed over the first cap layer and a second cap layer disposed over the intermediate layer;

patterning the first mask layer by using a first resist pattern as an etching mask;

patterning the second cap layer by using the patterned first mask layer as an etching mask;

forming a second mask layer over the patterned second cap layer, which has been patterned by using the patterned first mask layer;

patterning the second mask layer by using a second resist pattern as an etching mask;

patterning the patterned second cap layer, which has been patterned by using the patterned first mask layer, by using the patterned second mask layer as an etching mask;

patterning the intermediate layer and the first cap layer by using the patterned second cap layer, which has been patterned by using the patterned second mask layer, as an etching mask; and forming a bulk spacer layer in the patterned intermediate and first cap layers and sidewall spacers on sidewalls of the patterned intermediate and first cap layers, wherein the intermediate layer is made of an amorphous silicon.

18. The pattern forming method of claim 17, further comprising, after the bulk spacer layer is formed:
forming a third mask layer over the patterned second cap layer, which has been patterned by using the patterned second mask layer, the bulk spacer layer and the sidewall spacers;

patterning the third mask layer by using a third resist pattern formed on the third mask layer as an etching mask;

patterning the patterned second cap layer, which has been patterned by using the patterned second mask layer, by using the patterned third mask layer as an etching mask;

patterning the intermediate layer and the first cap layer by using the patterned second cap layer, which has been patterned by using the patterned third mask layer, as an etching mask; and patterning the bottom layer by using the patterned first cap layer as an etching mask.

19. The pattern forming method of claim 18, wherein:
the first cap layer includes one or more layers of $SiO_2$, SiCO and SiOCH, and
the second cap layer includes one or more layers of SiN, SiCN, SiC, BN and TiN.

20. The pattern forming method of claim 18, wherein:
the second cap layer includes one or more layers of $SiO_2$, SiCO and SiOCH, and the first cap layer includes one or more layers of SiN, SiCN, SiC, BN and TiN.

* * * * *